(12) United States Patent
Czelnik et al.

(10) Patent No.: US 10,936,108 B2
(45) Date of Patent: Mar. 2, 2021

(54) METHOD AND APPARATUS FOR INPUTTING DATA WITH TWO TYPES OF INPUT AND HAPTIC FEEDBACK

(71) Applicant: VOLKSWAGEN AG, Wolfsburg (DE)

(72) Inventors: Mark Peter Czelnik, Wolfsburg (DE); Michael Klaas, Schwülper (DE); Carsten Rieger, Lengede (DE)

(73) Assignee: Volkswagen AG

( * ) Notice: Subject to any disclaimer, the term of this patent is extended or adjusted under 35 U.S.C. 154(b) by 0 days.

(21) Appl. No.: 14/987,983

(22) Filed: Jan. 5, 2016

(65) Prior Publication Data

US 2016/0195989 A1   Jul. 7, 2016

(30) Foreign Application Priority Data

Jan. 5, 2015 (DE) ............... 10 2015 200 036.2

(51) Int. Cl.

| | |
|---|---|
| *G06F 3/041* | (2006.01) |
| *G06F 3/01* | (2006.01) |
| *G06F 3/0488* | (2013.01) |
| *B60R 11/02* | (2006.01) |
| *G06F 3/16* | (2006.01) |

(52) U.S. Cl.
CPC ........ *G06F 3/0416* (2013.01); *B60R 11/0217* (2013.01); *B60R 11/0235* (2013.01); *B60R 11/0264* (2013.01); *G06F 3/016* (2013.01); *G06F 3/017* (2013.01); *G06F 3/0412* (2013.01); *G06F 3/0488* (2013.01); *G06F 3/16* (2013.01)

(58) Field of Classification Search
CPC ........ G06F 3/016; G06F 3/017; G06F 3/0412; G06F 3/0414; G06F 3/0416; G06F 3/044; G06F 3/0488; G06F 3/16; B60R 11/0217; B60R 11/0264; B60R 11/0235; G60R 11/0235

See application file for complete search history.

(56) References Cited

U.S. PATENT DOCUMENTS

2002/0149561 A1   10/2002   Fukumoto et al.
2008/0024459 A1*   1/2008   Poupyrev ............... G06F 3/016
                                                                345/173

(Continued)

FOREIGN PATENT DOCUMENTS

| CN | 101118469 A | 2/2008 |
|---|---|---|
| CN | 102016778 A | 4/2011 |

(Continued)

OTHER PUBLICATIONS

Search Report for Chinese Patent Application No. 201610001511.4; dated Jan. 25, 2018.

*Primary Examiner* — LaTanya Bibbins
(74) *Attorney, Agent, or Firm* — Barnes & Thornburg, LLP

(57) ABSTRACT

A method and an apparatus, particularly in a motor vehicle, for input of data with haptic feedback. The method includes sensing a touch position on a user programmable touch-sensitive display device, selecting a function via the touch position, sensing of a contact pressure force on the user programmable touch-sensitive display device, initiating the selected function when a first force threshold is exceeded, and outputting a haptic feedback item. Also disclosed is an associated apparatus.

18 Claims, 11 Drawing Sheets

(56) References Cited

U.S. PATENT DOCUMENTS

| | | | | |
|---|---|---|---|---|
| 2011/0109578 A1* | 5/2011 | Waller | ............... | G06F 3/04883 |
| | | | | 345/173 |
| 2012/0299859 A1* | 11/2012 | Kinoshita | ............... | G06F 3/016 |
| | | | | 345/173 |
| 2014/0267114 A1 | 9/2014 | Lisseman et al. | | |
| 2014/0380187 A1* | 12/2014 | Gardenfors | ............. | G06F 3/017 |
| | | | | 715/748 |

FOREIGN PATENT DOCUMENTS

| | | |
|---|---|---|
| CN | 102308185 A | 1/2012 |
| CN | 103092406 A | 5/2013 |
| CN | 104063086 A | 9/2014 |
| DE | 102008035907 A1 | 2/2010 |
| KR | 20140034947 A | 3/2014 |
| WO | 2013104919 A1 | 7/2013 |

* cited by examiner

METHOD AND APPARATUS FOR INPUTTING DATA WITH TWO TYPES OF INPUT AND HAPTIC FEEDBACK

PRIORITY CLAIM

This patent application claims priority to German Patent Application No. 10 2015 200 036.2, filed 5 Jan. 2015, the disclosure of which is incorporated herein by reference in its entirety.

SUMMARY

Illustrative embodiments relate to a method and an apparatus for input of data with haptic feedback, particularly in a motor vehicle.

BACKGROUND

Modern motor vehicles are equipped with a multiplicity of supplementary functions that go beyond the pure transportation purpose of a motor vehicle. By way of example, these may be multimedia systems for receiving radio or reproducing media contents such as music, films or images, communication systems that allow worldwide voice-based or text-based communication, or even navigation systems that automatically compute the route on which the journey distance can be covered so as to save as much time as possible and to avoid queues as far as possible. In addition, systems are conceivable that provide the driver or an engineer what is known as an onboard computer with information about the state of the motor vehicle. A common feature of all of these systems is that they allow and presuppose interaction with the vehicle driver or the passengers via different input and output channels.

Illustrative embodiments provide a method and an apparatus in which the input is embodied both flexibly and interactively.

BRIEF DESCRIPTION OF THE DRAWINGS

Disclosed embodiments are explained in more detail below with reference to the figures, in which.

DETAILED DESCRIPTION OF THE DISCLOSED EMBODIMENTS

Figure 1:
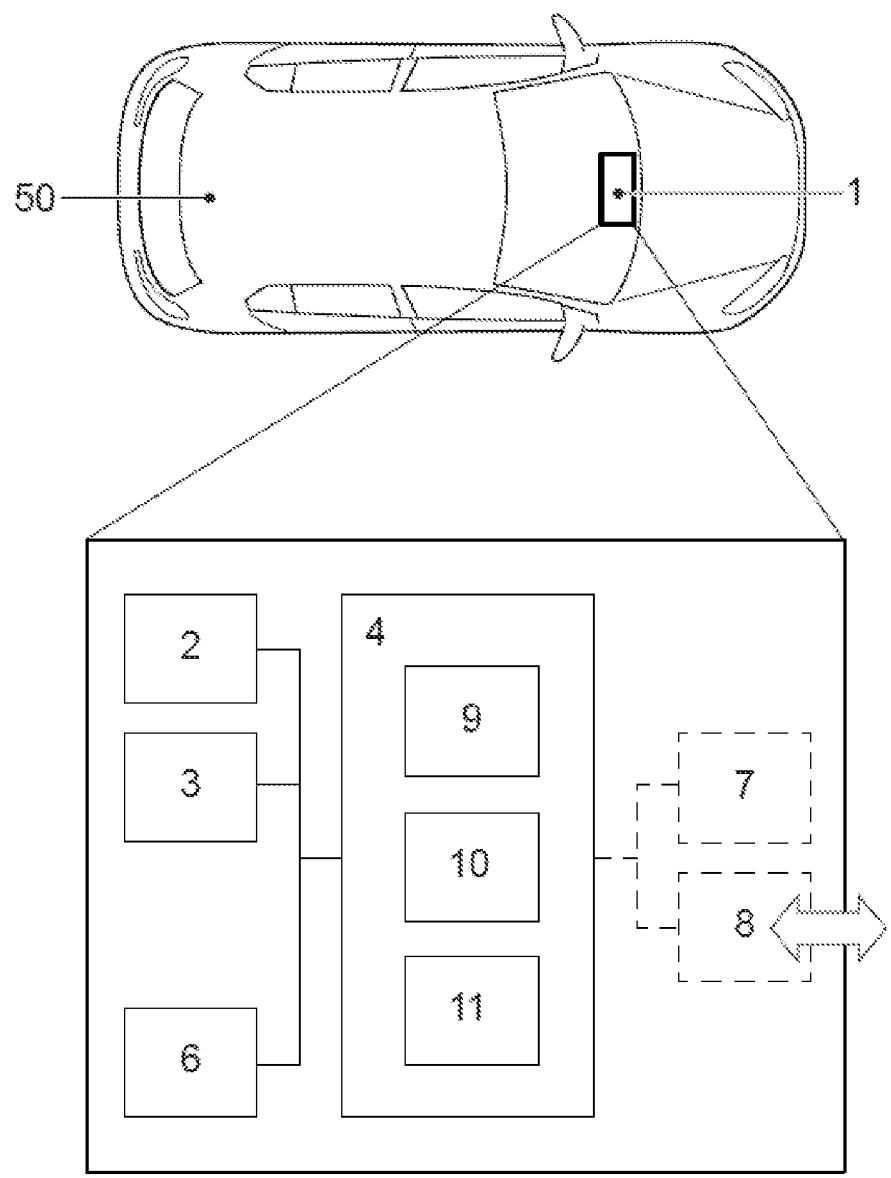
FIG. 1 shows a schematic illustration of a disclosed embodiment of the apparatus for input of data with haptic feedback.

Disclosed embodiments are based on the concept of using an apparatus having a touchscreen to combine an interactive mode of use, as known for modern touchscreens, with the interaction principle of a conventional key in physical form. Hence, two different input types are provided: one input type is formed by touch gestures, and the other input type is formed by push gestures. The provision of two input types allows more flexible, more differentiated and hence more interactive operator control of the electronic systems, particularly in motor vehicles. The possibility of control by touch gestures and initiation of the touch functions linked thereto ensures faster and more certain control, for example of the graphical representation. By contrast, push gestures are used for operating switches and keys that are virtual operator control elements. In this case, the push gestures are characterized in that initiation of operator control element functions requires a force threshold to be exceeded. The exceeding of a force threshold prevents an operating error, as occurs on account of a freely swinging arm, for example, that is unintentionally moved as a result of roadway unevennesses. A haptic feedback item during the push gesture furthermore recreates the sensory impression of a physical key.

DEFINITIONS

For purposes of the present disclosure, a touch position is a location of the touch by an operating element, for example a finger, on a touch-sensitive surface, for example that of a user programmable touch-sensitive display device that allows determination of the location of the touch. A finger is subsequently always assumed to be the operating element, without limiting the term operating element thereto, however.

For purposes of the present disclosure, a touch trace is a temporal and local combination of a plurality of touch positions. A touch trace has particular properties that arise from the trajectory of the combined touch positions, such as a direction, a speed or an acceleration. It has a starting point and an ending point. The touch positions do not necessarily need to be directly adjacent to one another. By way of example, a double click may also be a touch trace. The direction, the speed and the acceleration each arise from the direction, the speed or acceleration of the operating movement of the operating element effecting the touches.

For purposes of the present disclosure, a touch gesture is a classified touch trace. By way of example, properties such as direction, speed or acceleration of the trajectory of at least one touch trace are evaluated in this case.

For purposes of the present disclosure, a pressure force sensor is a device that determines a contact pressure on a surface of a body, for example a user programmable touch-sensitive display device, and outputs a value that correlates, and may be proportional, to the contact pressure, for example as an electrical signal. By way of example, such a pressure force sensor may be embodied as a strain gauge, as a piezo element or as an inductively or capacitively operating sensor.

For purposes of the present disclosure, a push gesture is characterized in that exceeding of a first force threshold and a subsequent drop below a second force threshold occur at a touch position, the second force threshold being lower than the first force threshold.

For purposes of the present disclosure, a touch function is a function that is initiated by a touch gesture. By way of example, such a touch function may be scrolling through a list, scrolling through a multipage text or menu or enlarging and reducing a view.

For purposes of the present disclosure, an operator control element function is a function that is initiated by a push gesture. By way of example, an operator control element function may be a function connected to a key that is recreated as a virtual operator control element, for example for the purpose of selecting a music track or a menu item.

For purposes of the present disclosure, an initiation region is a two-dimensional region in which either a touch function or an operator control element function can be initiated.

For purposes of the present disclosure, a virtual operator control element is the virtual recreation of a physical operator control element. The virtual operator control element has a graphical representation. The initiation region provided for initiation by means of a push gesture may be congruent with the presentation region of the graphical representation of the virtual operator control element.

For purposes of the present disclosure, a touch-sensitive position sensing unit is a two-dimensional flat body on whose one surface facing the user it is possible to determine at least one touch position when the operating element is in proximity to or on the surface of the body. By way of example, such a touch-sensitive position sensing unit may be a touchpad or a touchscreen. The touch-sensitive surface is called touch area.

For purposes of the present disclosure, a keypad denotes a set of keys that are arranged relative to one another and are virtual operator control elements. By way of example, a keypad may be a virtual recreation of the keys in the QWERTY arrangement, as in the case of standard PC keyboards, or of a numerical keypad.

Where the present text refers to the sensing or ascertainment of the contact force or of the contact pressure, it means sensing or ascertainment that is in a form separate from touch-sensitive position sensing. This is accomplished using at least one pressure force sensor that is produced in addition to the programmable touch-sensitive display device.

In particular, an input method, particularly in a motor vehicle, with haptic feedback, is therefore provided, comprising the following steps: sensing of a touch position on a user programmable touch-sensitive display device, selection of a function via the touch position, sensing of a contact pressure force on the user programmable touch-sensitive display device, initiation of the selected function when a first force threshold is exceeded, output of a haptic feedback item, wherein temporally and locally adjacent touch positions are combined to form touch traces and the touch traces are classified according to touch gestures, wherein functions are divided into touch functions and operator control element functions and an operator control element in a first initiation region on the user programmable touch-sensitive display device has an associated operator control element function that is initiated when the first force threshold is exceeded in the initiation region, provided that the touch positions previously sensed during a stipulated interval of time are located in the initiation region of the at least one virtual operator control element, wherein this exceeding of the first force threshold prompts a haptic feedback item to be output, and a subsequent drop below a second force threshold prompts a further haptic feedback item, which is different than the first, to be output, wherein at least one second initiation region on the user programmable touch-sensitive display device has at least one associated touch function that is initiated by a stipulated touch gesture.

In addition, an apparatus, particularly in a motor vehicle, for interactive input of data with haptic feedback is provided that comprises a user programmable touch-sensitive display device for sensing a touch position and presenting information, a pressure force sensor, which is directly or indirectly connected to the user programmable touch-sensitive display device, for sensing a contact pressure force, an actuator element, which is directly or indirectly connected to the user programmable touch-sensitive display device, for outputting a haptic feedback item, and a control device, wherein the control device is in a form such that it combines temporally and locally adjacent touch positions to form touch traces and classifies them according to touch gestures, and the control device presents at least one virtual operator control element on the user programmable touch-sensitive display device, wherein the at least one virtual operator control element has an associated first initiation region on the user programmable touch-sensitive display device and an associated operator control element function, wherein the control device monitors the contact pressure force and, in the event of a first force threshold being exceeded, initiates the operator control element function, provided that the touch positions previously sensed during a stipulated time interval are located in the initiation region of the at least one virtual operator control element with which the operator control element function is associated, wherein this exceeding of the first force threshold prompts the control device to output a signal to the actuator element, and a subsequent drop below a second force threshold is followed by a further signal, which is different than the first signal, being output on the actuator element, wherein the control device associates at least one touch function with at least one second initiation region on the user programmable touch-sensitive display device and, when a stipulated touch gesture occurs, initiates the at least one touch function.

The user can use both touch gestures for simple operator control, for example of the graphical interface, and a push of a key, which is known from conventional keys, i.e., a push gesture for initiating operator control element functions. The touch gestures can be used to perform the menu control, for example, such as scrolling through lists or scrolling through menus. It is likewise conceivable for image or map views to be moved or for these views to be enlarged and reduced. Alternatively, other touch functions may be defined. The haptic feedback item is two successive, different signals on the actuator element that are coupled to the force thresholds is used to recreate the sensory impression of a key in physical form, for example the key of a PC keyboard or the membrane keypad of a mobile telephone. It has been found that above all the second haptic feedback item is necessary for realistic recreation of the sensory impression of a key. The user is therefore provided with a broad and differentiated sensory feedback item about his control processes. Operator control therefore becomes more interactive, simpler and, as a result of the two different input types and the differentiated haptic feedback item, also results in fewer operating errors, since it is possible for an operator control element function to be initiated only after the first force threshold has been exceeded. The driver needs to avert his eyes from the roadway less often to monitor his inputs. He therefore always has the roadway in his line of vision and can still make inputs in a specific manner. In addition, there is the assurance that unintentional initiation of an operator control element function after "slipping off" a virtual operator control element when increasing the contact force, for example on account of a vehicle vibration caused by roadway unevennesses, does not occur, since, when the first force threshold is exceeded, the previously sensed touch position must be located within the initiation region of the virtual operator control element for an operator control element function to be initiated. Consequently, operating errors are reduced.

In particular, an improved apparatus for a motor vehicle and an improved method for a motor vehicle for input of data are therefore provided.

In at least one disclosed embodiment, the touch function is initiated only when the contact pressure force is below the first force threshold. This ensures that an attempt at initiation of an operator control element function cannot be regarded as a touch function, for example if the finger operating a virtual operator control element "slips off" the latter on account of a vehicle vibration.

Even if the finger is swept over the initiation region of a virtual operator control element and the first force threshold is exceeded on account of a roadway unevenness and the resultant movements of the finger, the operator control element function is not initiated. The operating error is recognized and the operator control element function associated with the virtual operator control element is not initiated.

Generally, the disclosed embodiments can be applied to all interactive operator control operations and menu forms, for example the map interaction in a navigation system, for the text input on a virtual keypad (speller), list interaction, for example for destination selection in a navigation system or track selection on a CD or MP3 player, vertical list interaction or in interaction with a menu bar, interaction with a graphical list, for example a list of the covers of music albums (CoverFlow), and for the setting of slide controls, rotary controls, pushbutton switches, switches or other virtual operator control elements.

In a disclosed embodiment, at the same time as or with a subsequent or prior delay in respect of the haptic feedback items, an audible signal is output. In this case, the audible signal may be, by way of example, a sound sample of a key in a physical form, for example the typical click sound that arises when the key is pushed. Alternatively, other sounds can form the audible signal. The audible signal for every single one of the haptic feedback items may be the same or different in this case. It is also conceivable for the touch traces to initiate audible signals, for example the playback of a sound sample that represents the sound of turning the page of a book, and that is played back when scrolling through a menu. The haptic feedback item is perceived more intensely by the user on account of psychological perception effects. This can be utilized, for example by reducing the intensity of the haptic feedback item, which contributes to less wear on the actuator element and a long life.

The audible signal is output on a loudspeaker that is situated in proximity to or at the position of the apparatus, particularly the touch-sensitive position sensing device. The user then automatically links the audible signal to the haptic feedback item and hence to the operator control process on the apparatus. It is also conceivable for the audible signal to be output via one or more loudspeakers of a multimedia system that is present in the motor vehicle, for example a multichannel multimedia system.

In a disclosed embodiment, the first initiation region and the second initiation region overlap. This allows a two-dimensional region to be provided both with touch functions and with operator control element functions. By way of example, it is thus possible for a key to be positioned in a map. By way of example, the map can then be moved by means of the touch gestures, with the key also being moved. If the user then wishes to initiate the operator control element function linked to the key, he pushes the key and initiates the operator control element function by exceeding the first force threshold. This allows the user interface and the interaction to be made more flexible.

Ideally, an embodiment is produced in which the operator control element function is not initiated when the first force threshold is exceeded if the first force threshold is exceeded at a point on a touch trace that is classified as a touch gesture. This ensures that there is no operating error when, by way of example, a touch trace has a starting point outside a virtual operator control element, but subsequent points are situated in the region of the virtual operator control element.

In at least one disclosed embodiment, the touch function is initiated only if the contact pressure force during sensing of the touch positions that result in the touch trace that represents the touch gesture is below the first force threshold.

In a further disclosed embodiment, the operator control element function has a delay. By way of example, an operator control element function can, following initiation when the first force threshold is exceeded, be initiated again only after a particular time. This is intended to prevent there being undesirable multiple initiations of the operator control element function and hence an undesirable operating error.

In a further disclosed embodiment, the touch functions also prompt a haptic feedback item to be output via the actuator element. This allows not only the visual feedback item but also a further sensory feedback item. This facilitates operator control and reduces operating errors.

In a further disclosed embodiment, besides the first and second force thresholds there are further force thresholds defined that initiate a haptic feedback item. By way of example, the further force thresholds and the corresponding haptic feedback items can be used to recreate the sensory perception of a physical key even more accurately. By way of example, the force profile and the behavior of a physical during pushing of a key could be recorded and then recreated using the first, second and further force thresholds and corresponding haptic feedback items. It is thus possible for various physical keys to be recreated exactly. Optionally, the audible behavior of a physical key is recorded at the same time and later played back by the apparatus at the same time as or with a subsequent or prior delay in respect of the haptic feedback items. This provides the user with the impression that he is operating a key in a physical form.

In a disclosed embodiment, the apparatus comprises an interface for data interchange. By way of example, the control device provides the touch position, the initiated operator control element function or touch functions and/or further data on the interface. The interface may be a standard interface, for example the CAN bus that is standard in motor vehicles. Alternatively, the interface may be in a different embodiment.

In at least one disclosed embodiment, the control device is controlled via the interface. By way of example, this allows the method and the associated apparatus to be controlled via an external computer or controller, for example a main computer of the motor vehicle. By way of example, it is thus possible for the menu functions and the positions of the initiation regions of the virtual operator control elements to be sent from the main computer via the interface to the control device, which then presents them on the touch-sensitive display. The interaction with the user takes place subsequently: by way of example, he operates a virtual operator control element and, by exceeding the first force threshold, initiates the operator control element function, the initiation of the operator control element function being sent via the interface to the main computer, where the information is processed further. By way of example, this generates a new menu page, which is then presented on the user programmable touch-sensitive display device following renewed communication with the control device via the interface.

In a disclosed embodiment, the information presented on the user programmable touch-sensitive display device changes when a gesture function or an operator control element function has been initiated. By way of example, the graphical representation of a virtual operator control element can change during the push gesture. By way of example, it is thus possible to recreate a physical key by means of a 3D animation or the casting of a shadow. In the case of a gesture function, the touch trace could be followed graphically, for example. Alternatively, other options are conceivable for how the presented information can change. This allows an additional visual feedback item or extended interaction options.

In a disclosed embodiment, the haptic feedback items are embodied as pulsed deflections of a touch area of the user programmable display area, which may have a deflection and return of the touch area to a position of rest or an initial position and possibly one or more heavily attenuated post-transients or overshoots.

In at least one disclosed embodiment, the apparatus is particularly designed for integration in an interior of a motor vehicle, particularly in a cockpit of the motor vehicle, or a headrest, a roof lining or a central console in the rear region of the motor vehicle.

All embodiments that are described for a motor vehicle can also be implemented in further embodiments without the motor vehicle. Thus, the disclosed input method and the disclosed apparatus may be developed in all areas in which machine/man interaction takes place at a man/machine interface, for example in a computer, a laptop, a tablet computer, a smartphone, an interactive table, a transport ticket machine, an information column, an interactive control apparatus, in control consoles and in computers that assist blind people.

FIG. 1 shows an embodiment of the apparatus 1 for input of data. A motor vehicle 50 contains the apparatus 1 in the passenger compartment, for example in the central console. The apparatus comprises a user programmable touch-sensitive display device 2 that has an actuator element 3 and a pressure force sensor 6 directly or indirectly connected to it. The user programmable touch-sensitive display device 2 has a touch area 12. The user programmable touch-sensitive display device 2, the actuator element 3 and the pressure force sensor 6 are connected to a control device 4. The control device 4 comprises an integration device 9, a classification device 10 and a comparison device 11. Optionally, the apparatus 1 may have a loudspeaker 7 connected to the control device 4, optionally on or in proximity to the user programmable touch-sensitive display device 2. An interface 8 connected to the control device 4 for the purpose of communication with external appliances is likewise optional.

The control device 4 defines virtual operator control elements and first and second initiation regions. The virtual operator control elements are presented as a graphical representation on the user programmable touch-sensitive display device 2. Furthermore, the control device 4 can present further graphical representations, symbols, letters or pictograms on the user programmable touch-sensitive display device 2. The user programmable touch-sensitive display device 2 senses at least one touch position and supplies it to the control device 4. The integration device 9 combines temporally and locally adjacent touch positions to form touch traces and forwards the touch traces to the classification device 10. The classification device 10 classifies the touch traces according to touch gestures.

At the same time as the at least one touch position is sensed, a contact pressure on the user programmable touch-sensitive display device 2 is sensed by the pressure force sensor 6 and forwarded to the control device 4. The comparison device 11 then compares the classified touch traces and the contact pressure with a list of touch functions and operator control element functions that is stored in the comparison device 11 or the control device 4, for example. If a classified touch trace satisfies the criteria of one of the touch functions stored in the list, the relevant touch function is initiated. Optionally, the control device 4 can, at the same time as the touch function is initiated, output a signal to the actuator element 3 and/or a further signal to the loudspeaker 7. If a first force threshold on the pressure force sensor 6 is exceeded and if the touch positions previously sensed in a prescribed period of time are all located in the initiation region of a virtual operator control element, then the operator control element function associated with this operator control element is initiated and the control device 4 outputs a signal to the actuator element 3 when the first force threshold is exceeded; a subsequent drop below a second force threshold on the pressure force sensor 6 prompts the control device 4 to output a further signal to the actuator element 3. Optionally, exceeding of the first force threshold and/or a drop below the second force threshold can each prompt, at the same time as or with a subsequent or prior delay in respect of the relevant signal to the actuator element 3, output of a signal or of a plurality of signals from the control device 4 to the loudspeaker 7. A check to determine whether all the touch positions were or are located in the initiation region of a virtual operator control element in the prescribed period of time before the first force threshold is exceeded can be performed by the comparison device, for example, for the purpose of classifying the touch traces. This involves the first initiation region associated with the virtual operator control element being treated as a second initiation region, with a touch trace being classified as static or quasi-static if all the touch positions are located in the prescribed initiation region. When a static or quasi-static touch trace is classified for a first initiation region, the condition is met if the touch trace comprises at least all the touch positions that are located within the prescribed period of time.

Depending on the type of touch function or operator control element function that has been initiated, the control device 4 can change the graphical representation on the user programmable touch-sensitive display device 2 or leave it unchanged. Optionally, the touch position, the contact pressure, the touch trace and/or further data can be output to the interface 8. It is likewise possible for the control device 4 to be parameterized using the interface 8, for example by a central computer of the motor vehicle 50.

Optionally, the apparatus is designed such that the tasks of the integration device 9, the classification device 10, the comparison device 11 and generally the control device 4 are performed on a software basis, for example in a single computer or microcontroller.

Figure 2:
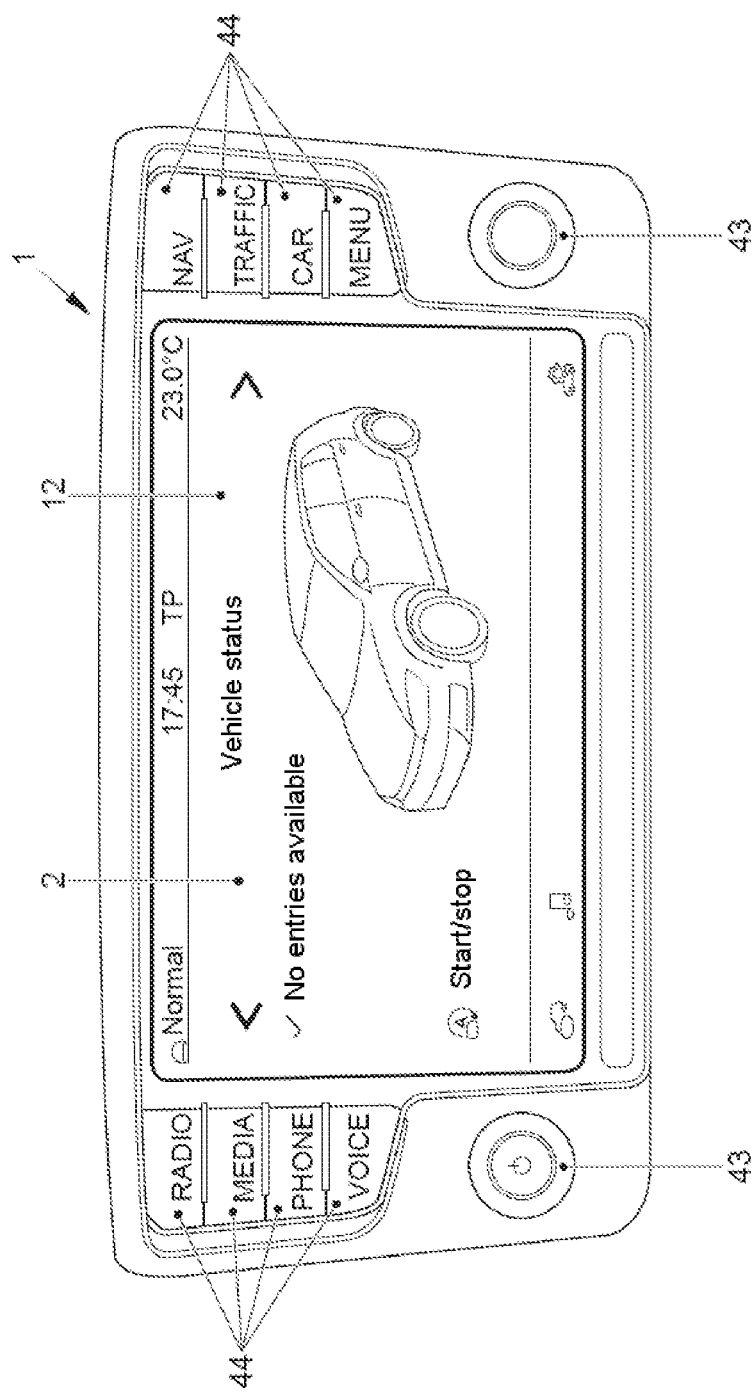
FIG. 2 shows a schematic front view of a disclosed embodiment of the apparatus in a motor vehicle for input of data with haptic feedback.

FIG. 2 schematically depicts a front view of an embodiment of the apparatus 1. In this case, the apparatus 1 is integrated in a multimedia display operator control apparatus 40, as are standard today in mid-range and top of the range motor vehicles. Only the user programmable touch-sensitive display device 2 is visible in the front view. The control device 4, the pressure force sensor 6 and the actuator element 3, and also the optional loudspeaker 7, are not visible in the front view. Arranged next to the user programmable display apparatus 2 are keys 44 in a physical form. These allow direct selection of particular operator control contexts on the user programmable display device 2. In addition, the display operator control apparatus 40 comprises two continuous rotary controls 43 in a physical form, which are likewise used in a context-dependent manner, for example for adjusting the volume or a radio station.

Figure 3:
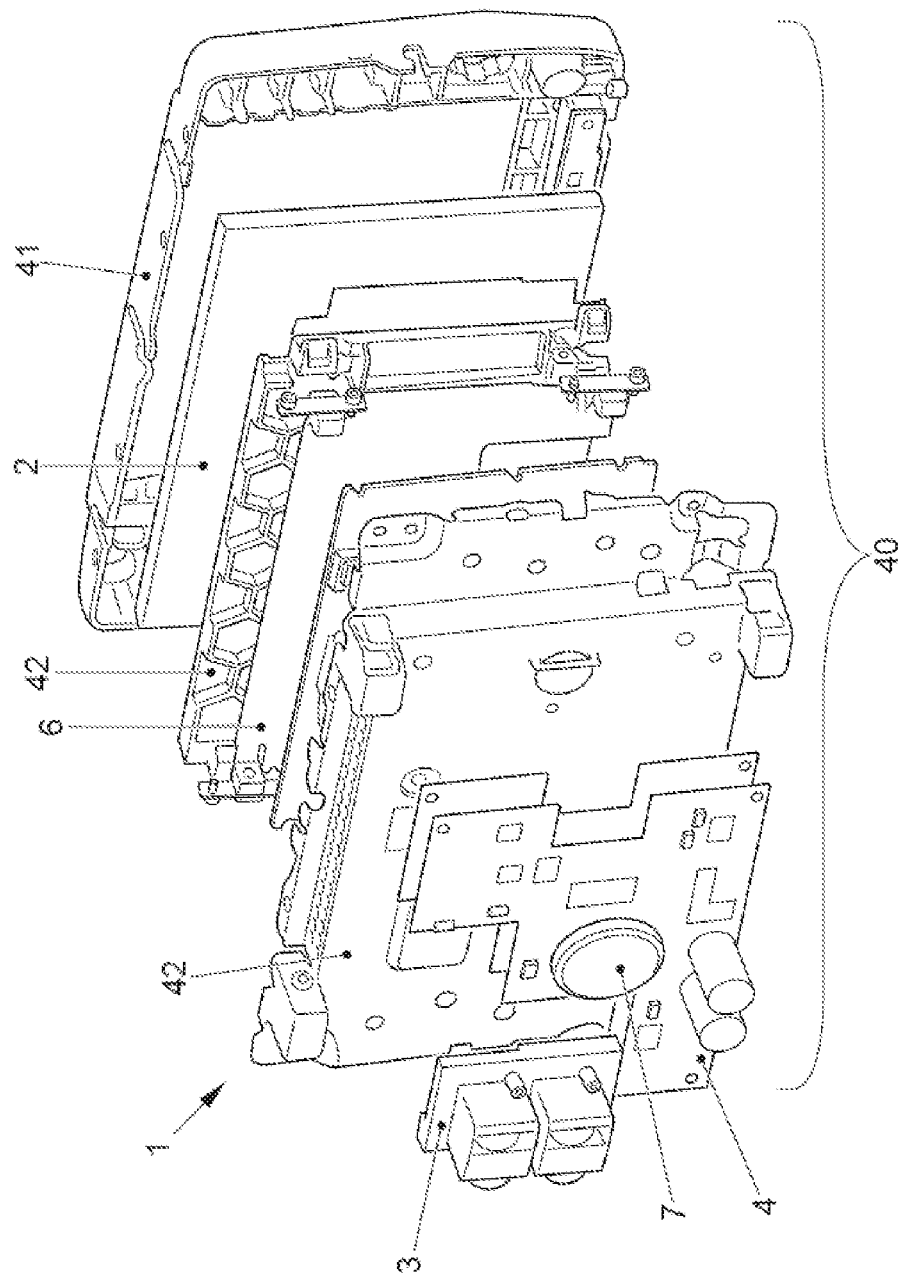
FIG. 3 shows a rear exploded view of a disclosed embodiment of the apparatus.

FIG. 3 shows a perspective rear exploded view of an embodiment of the apparatus 1. Behind a front cover 41 of a multimedia display operator control apparatus 40 there is a user programmable touch-sensitive display device 2. Behind the user programmable touch-sensitive display device 2 there is a bracket on which a pressure force sensor 6 or pressure force sensors are produced. On the rear of the display operator control apparatus 40, there is a control device 4 and an actuator element 3 that is directly or indirectly connected to the housing. The signal that is output to the actuator element 3 by the control device 4 for the purpose of haptic feedback propagates via the bracket of the display operator control apparatus 40 as far as the user programmable touch-sensitive display device 2 and is therefore transmitted to the finger of the user. In this case, the actuator element 3 can be deflected either parallel or at right angles to the plane of the user programmable touch-sensitive display device 2. In at least one disclosed embodiment, a deflection by the actuator element 3 takes place only parallel to the area of the user programmable touch-sensitive display device 2. A parallel deflection permits the user programmable touch-sensitive display device 2 to be embodied more rigidly in respect of a deflection or flexure in the direction of operation, i.e., at right angles to the display area, which gives the user the impression of a relatively high significance of the display operator control apparatus 40 in terms of quality. Furthermore, in the case of parallel deflection, the distance between the user programmable touch-sensitive display device 2 and the front cover 41 or other elements of the display operator control apparatus 40 may be relatively short, so that a relatively small gap measurement means that there is less contamination of the interior of the display operator control apparatus 40 with dust, etc. By contrast, deflection of the actuator element 3 at right angles allows the user to perceive the haptic feedback item on the finger more intensely and, as a result, the signal on the actuator element 3 can be less pronounced.

Optionally, there is a loudspeaker 7 situated on the control device 4. The position of the loudspeaker 7 in proximity to the touch-sensitive position sensing device 2 and the display device 5 allows the audible signal to be associated with the position of the display operator control apparatus 40 in the motor vehicle by the user. This arrangement motivated by psychological perception considerations increases the user's perception of the feedback item. Owing to the enhanced perception of joint audible and haptic feedback, it is possible for the intensity of the signal on the actuator element 3 to be reduced for the same sensory impression, which reduces the wear on the actuator element 3 and hence increases the life of the actuator element 3. Further housing portions 42 are used for affixing or stiffening the multimedia display operator control apparatus 40.

Figure 4:
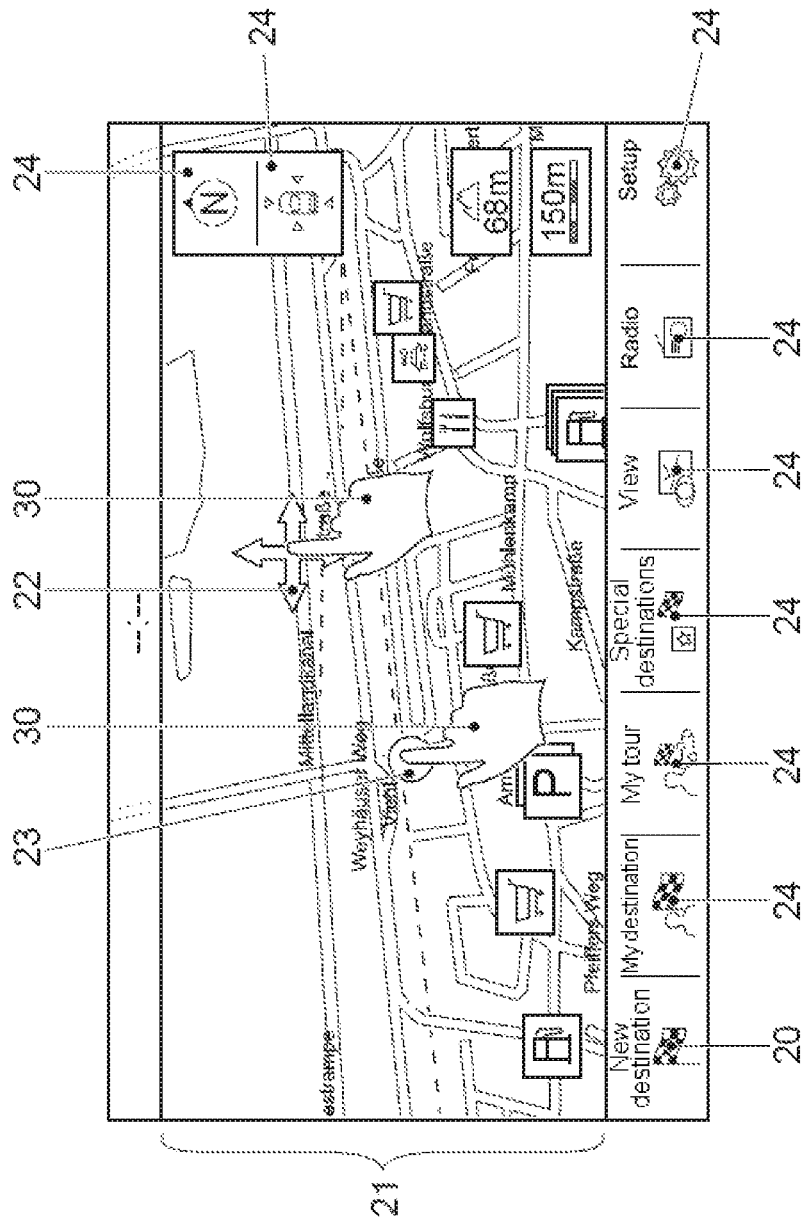
FIG. 4 shows a schematic illustration of a map view on the user programmable touch-sensitive display device and of both input types.

FIG. 4 depicts a schematic illustration of a road map 21, for example for routing or destination input in a navigation system, on a user programmable touch-sensitive display device 2 to clarify the two input types. The finger of a user 30 can touch directly represented positions on the user programmable touch-sensitive display device, so that the touch position can be sensed. The user programmable touch-sensitive display device presents a virtual operator control element 20, for example a key linked to an operator control element function for selection of a new destination. Also presented are further virtual operator control elements 24, which are linked to other operator control element functions. The user can now perform interactive control operations by touching with the finger of the user 30. By way of example, a touch gesture 22, for example swiping of the finger of the user 30 back and forth, can move the road map 21 by initiating a touch function. The touch function then changes the region of the road map 21 that is presented on the user programmable touch-sensitive display device. Also conceivable for a road map 21 are touch gestures for enlarging or reducing, rotating or centering the road map 21, for example. In this embodiment, the second initiation region for the touch functions is identical to the entire display area. In other embodiments, there may be a plurality of second initiation regions that are disjunct from one another or overlap. In the case of disjunct second initiation regions, the same touch gesture may have a different associated touch function on the basis of the respective initiation region.

The operator control element functions linked to the virtual operator control element 20 and the further virtual operator control elements 24 can be initiated only by means of a push gesture 23. This requires the finger of the user 30 to exceed a first force threshold by pushing on the user programmable touch-sensitive display device in the initiation region of the virtual operator control element. In this case, the initiation region is identical to the presentation region of the virtual operator control element, for example. When the first force threshold is exceeded, an operator control element function, in this case the interactive selection of a destination on the road map 21, for example, is initiated. At the same time, a haptic feedback item is provided by means of an actuator element that is directly or indirectly connected to the user programmable touch-sensitive display device. This haptic feedback item, for example by means of output of a pulse or other signal by the actuator element, is transmitted to the finger of the user 30, so that the user perceives the signal by means of his senses.

As the push gesture 23 progresses, the finger of the user 30 decreases the contact pressure on the user programmable touch-sensitive display device, and a drop below a second force threshold prompts the provision of a further haptic feedback item by means of output of a further pulse or signal to the actuator element. The first and second force thresholds, and also the different haptic feedback items, can be used to recreate the sensory knowledge when pressing a physical key, so that the user can be provided with differentiated sensory knowledge. Optionally, a respective audible signal can be output to a loudspeaker at the same time as the haptic feedback items, for example a sound sample that recreates the sound when pressing a physical key. If necessary, this signal can be provided with a subsequent or prior delay in relation to the first and/or second force threshold to compensate for propagation times of the sound and to make perception as realistic as possible. Optionally, the two sound samples for the two haptic feedback items are different.

Figure 5:
FIG. 5 shows a schematic illustration of a keypad on the user programmable touch-sensitive display device and of both input types.

FIG. 5 schematically shows a further example of the interaction using the two input types. A user programmable touch-sensitive display device presents a keypad 25. The keypad 25 consists of single keys that each represent a letter of the Latin alphabet. Each key is a virtual operator control element, and in this case only a virtual operator control element 20 for the key for the letter "R" is marked by way of example. For reasons of clarity, the other keys have not been marked additionally. A typical input will now be explained on the basis of input of the two letters "F" and "A". The user places his finger 30 on the initiation region of the virtual operator control element 20 that belongs to the letter "F". There, he increases the contact pressure and exceeds a first force threshold with this push gesture 23. This exceeding of the first force threshold initiates an operator control element function, in this case the input of the letter "F" into the input field 26. At the same time, a pulse or another signal is output via an actuator element. The finger 30 of the user then decreases the contact pressure and drops below a second force threshold. The drop below the second force threshold results in further output of a further pulse or a further signal via the actuator element. Optionally, an audible signal can be output via a loudspeaker at the same time or with a subsequent or prior delay. Following input of the letter "F", the user leaves his finger 30 on the surface of the touch-sensitive position sensing device and swipes two keys to the left and positions his finger 30 on the virtual operator control element or the key that belongs to the letter "A". With this touch gesture 22, a touch function can be initiated, for example, output of a haptic, visual or optical feedback item, or no function is initiated. Once it has arrived at the virtual operator control element, the finger 30 of the user performs a push gesture 23 again and therefore inputs the letter "A" into the input field 26. The haptic or audible feedback item is provided in a similar manner to the push gesture 23 on the key of the letter "F" that was outlined above.

As a departure from the embodiment described, the letters "F" and "A" can also each be input or sensed only when there is a drop below the second force threshold.

Figure 6:
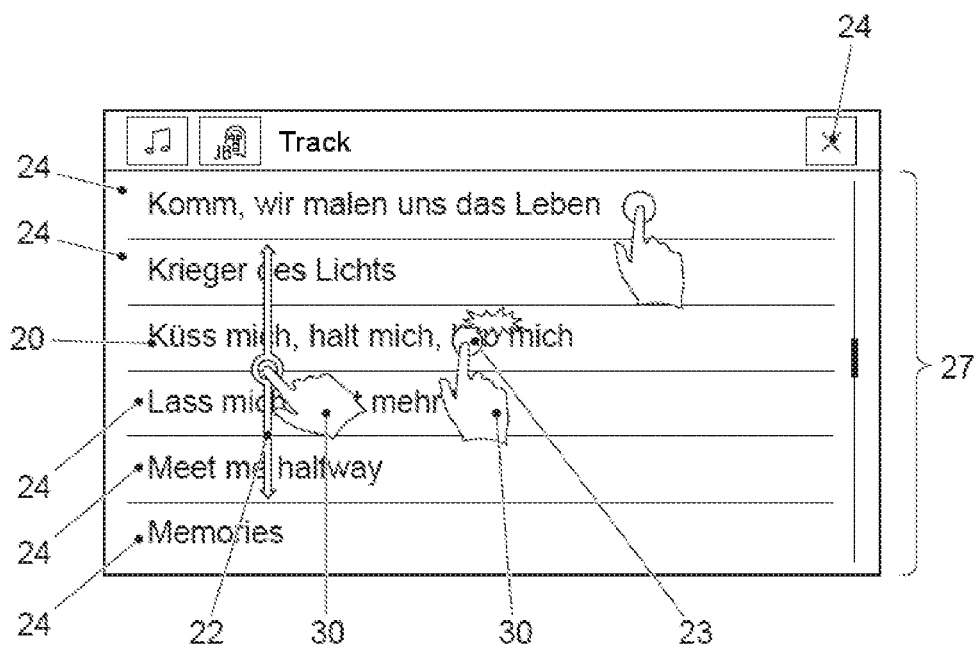
FIG. 6 shows a schematic illustration of a vertical list on the user programmable touch-sensitive display device and of both input types.

FIG. 6 shows an example of a selection list 27 and also the two input types. The selection list 27 consists of a virtual operator control element 20 and a plurality of further virtual operator control elements 24. The selection list 27 can be scrolled by means of a touch gesture, in this case movement of the touch position of the finger 30 of the user upward and downward, for example, so that the virtual operator control element 20 and the further virtual operator control elements 24 are moved and, if available, other further virtual operator control elements 24 become visible and selectable. If desired, when initiated by the touch gesture 22, a haptic or audible feedback item can be provided by means of output of an appropriate signal to the actuator element or the loudspeaker. If the user now wishes to select a list entry, for example a music track, he performs a push gesture 23 on the list entry and thereby performs an operator control element function, in this case selection or playback of the music track. The feedback item is provided in a similar manner to the description of FIGS. 4 and 5.

Figure 7:
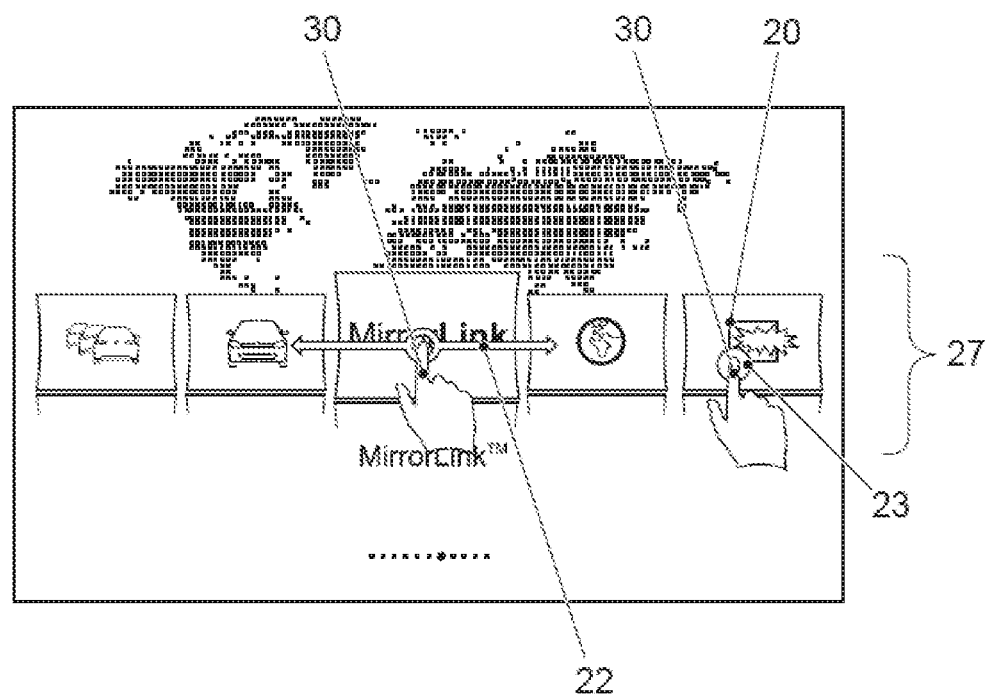
FIG. 7 shows a schematic illustration of a horizontal list on the user programmable touch-sensitive display device and of both input types.

FIG. 7 schematically shows the two input types for a selection list 27 that is in a horizontal form. In this case, scrolling through the list is effected by means of a touch gesture 22 in a lateral direction. The selection of a list entry and the haptic or audible feedback are effected in a manner similar to that outlined in the description of FIG. 6 by means of a push gesture 23 from the finger 30 of the user.

Figure 8:
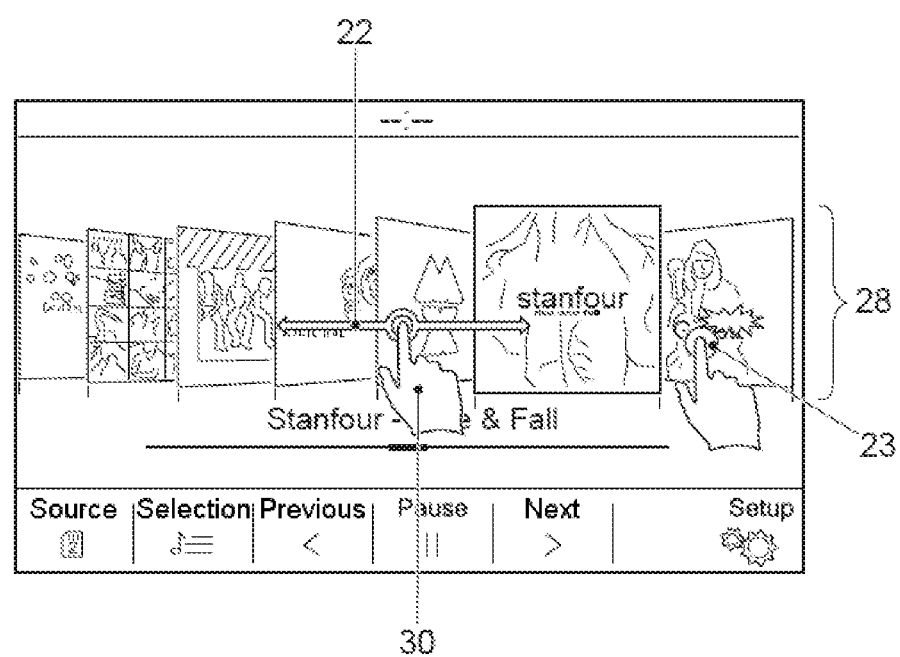
FIG. 8 shows a schematic illustration of a cover list on the user programmable touch-sensitive display device and of both input types.

FIG. 8 shows the two input types for a cover list 28 that is compiled from various covers of music albums. In this case, scrolling through the list is effected again by means of a touch gesture 22 in a lateral direction. The selection of a list entry, in this case an album, and the haptic or audible feedback are effected in a manner similar to that outlined in the description of FIG. 6 and FIG. 7 by means of a push gesture 23 on the virtual operator control element 20 by the finger 30 of the user.

Figure 9:
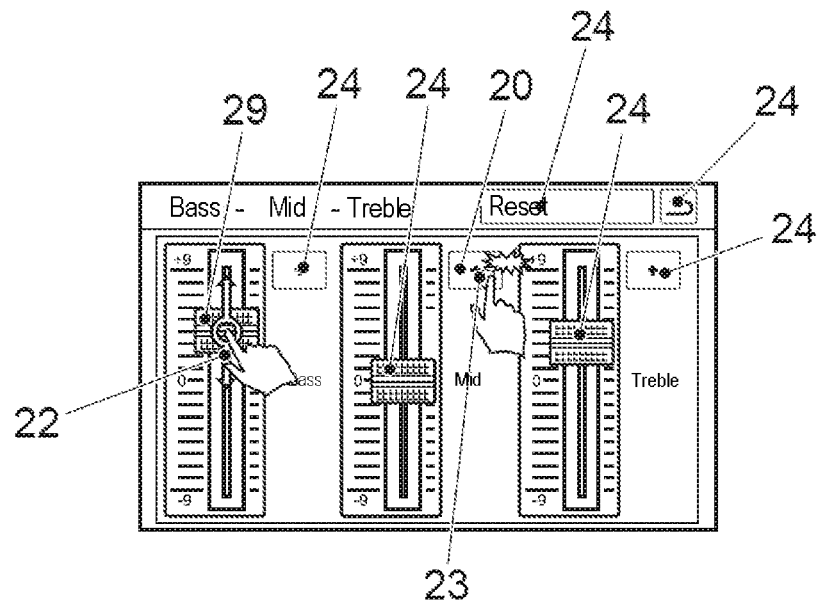
FIG. 9 shows a schematic illustration of slide controls on the user programmable touch-sensitive display device and of both input types.

FIG. 9 schematically shows the two input types for operator control of buttons and slide controls 29 that are a virtual operator control element 20 and further virtual operator control elements 24. In this embodiment, the slide control 29 is moved to and fro by a simple touch gesture 22. Alternatively, it is conceivable for a slide control 29 first to have to be unlocked by means of a push gesture 23, then to be able to be moved by means of a touch gesture 22 and then to have to be locked or inhibited again. The operator control element function of the virtual operator control element 20, which in this case is a button, is initiated by means of a push gesture 23. The haptic or audible feedback is effected in a manner similar to that outlined in the descriptions of FIGS. 4-8.

In the figures, a finger of the user 30 is always used as operating element. In general, however, other operating elements are also conceivable. By way of example, these may be items of clothing that surround the finger of the user 30, or else even pens or other objects.

Figure 10:
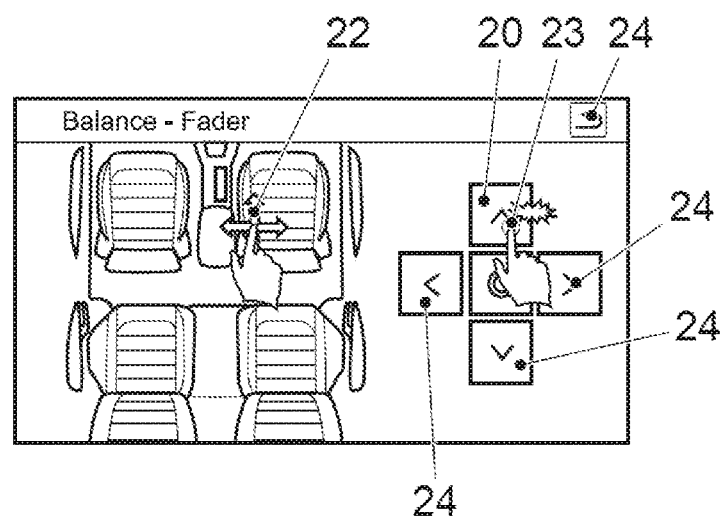
FIG. 10 shows a schematic illustration of position controls on the user programmable touch-sensitive display device and of both input types.

FIG. 10 schematically shows the two input types for operator control of recreated pushbutton switches that are virtual operator control elements 20 and further virtual operator control elements 24. A touch gesture 22 on the graphical representation of a plan view of the passenger compartment can be used to position crosshairs that are subsequently defined, for example as a central position for music reproduction. The operator control element function, in this case step-by-step movement of the central position (balance) for music reproduction, linked to the virtual operator control element 20—shown to the right thereof—of the pushbutton switch is initiated by a push gesture 23. The haptic and audible feedback is effected in a manner similar to that outlined in the descriptions of FIGS. 4-9.

Figure 11A:
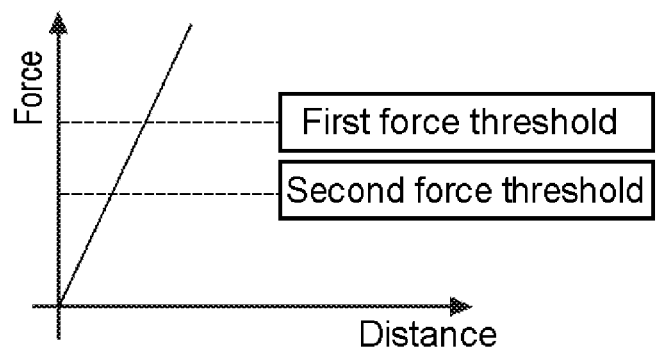
FIGS. 11*a* and 11*b* show a schematic illustration of the profile of the contact pressure force and of a first and a second force threshold.
Figure 11B:
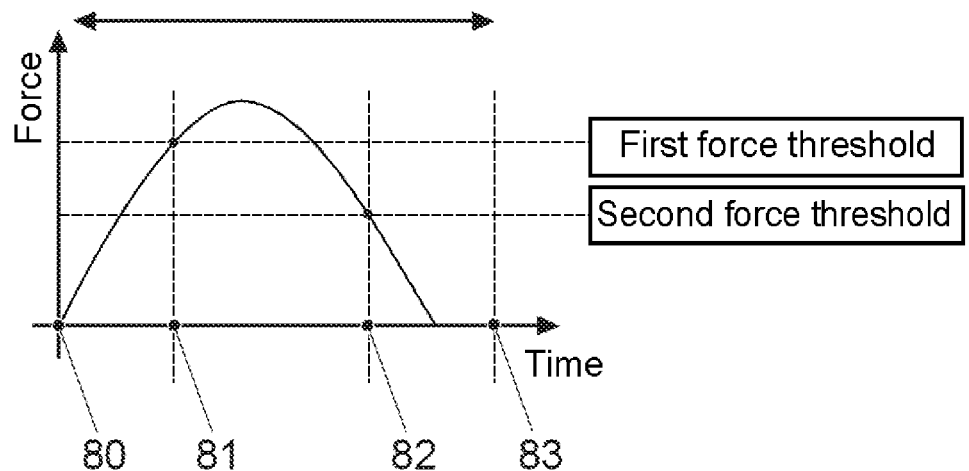

FIGS. 11a and 11b show an example of a schematic profile of the contact pressure force during a push gesture, and haptic, and optionally audible, feedback items initiated via a first and a second force threshold. At the beginning of the push gesture, the finger is placed onto a user programmable touch-sensitive display device 80. The user then increases the contact pressure force, and in this case, as shown in FIG. 11a, a linear relationship is assumed between the deflection of the user programmable touch-sensitive display device at right angles and the contact pressure force that results or that is sensed via the pressure force sensor. The contact pressure force then exceeds the first force threshold, resulting in output of a haptic feedback item 81. Optionally, an audible feedback item is output via a loudspeaker at the same time or with a subsequent or prior time delay. The contact pressure force then exceeds a maximum and subsequently becomes smaller again. A drop below a second force threshold prompts output of a further haptic feedback item via the actuator element, and optionally also a further audible feedback item via the loudspeaker 82. To conclude the push gesture, the finger is raised again 83. Alternatively, it is conceivable for the finger to remain on the user programmable touch-sensitive display device, for example to perform further touch gestures or push gestures.

Figure 12:
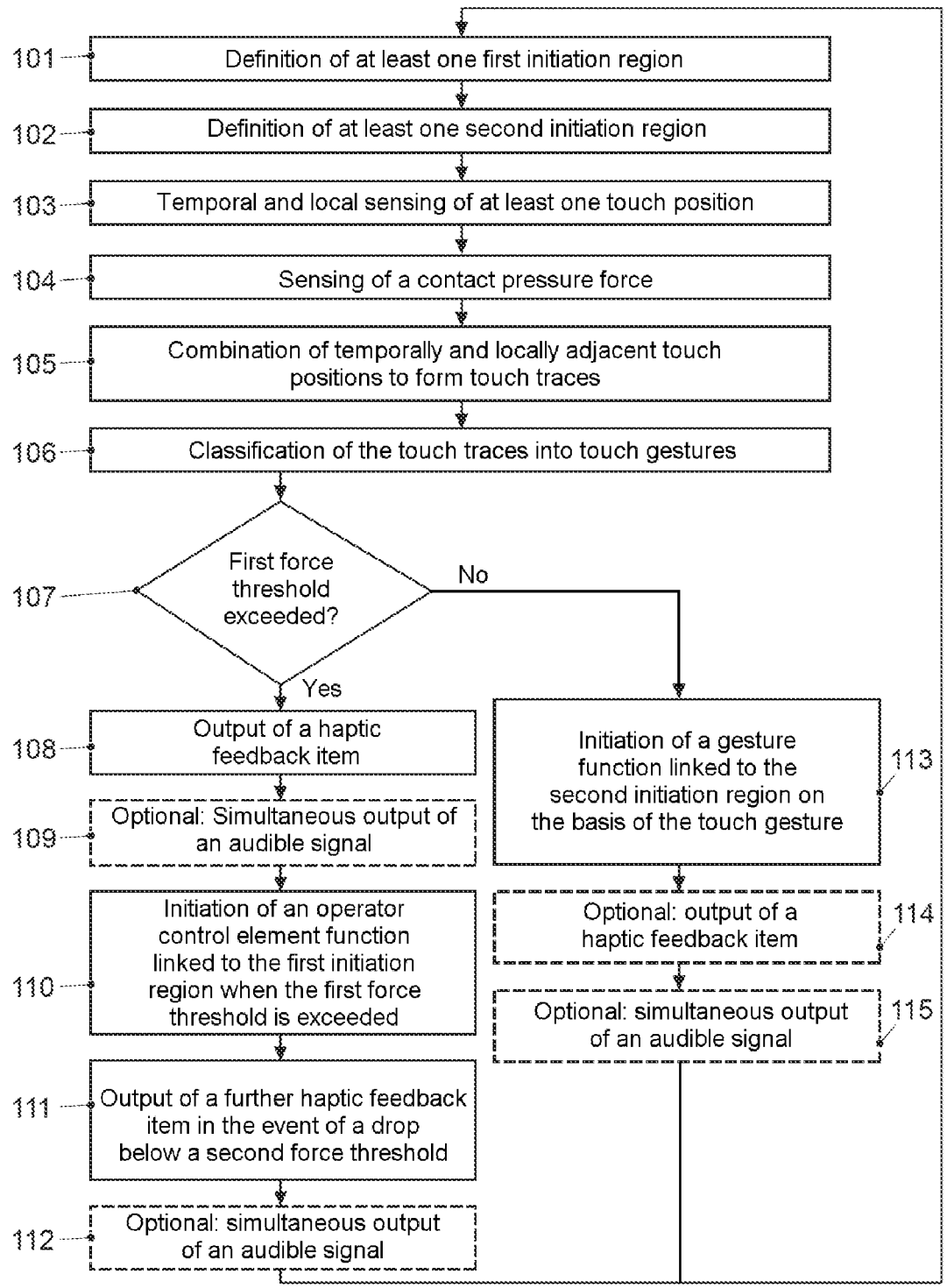
FIG. 12 shows a schematic flowchart for the method.

FIG. 12 shows a schematic flowchart for the method for capturing data in a motor vehicle using the two input types. First of all, at least one first initiation region having virtual operator control elements is defined 101. Next, at least one second initiation region is defined 102. Next, at least one touch position, for example on a user programmable touch-sensitive display device, is sensed temporally and locally 103. Additionally, a contact pressure force is sensed 104. Next, adjacent touch positions are combined temporally and locally to form touch traces 105 that are then classified according to touch gestures 106. If a first force threshold is exceeded 107, a haptic feedback item is provided 108. Optionally, an additional audible feedback item can be provided at the same time or with a subsequent or prior delay 109. When the first force threshold is exceeded, an operator control element function linked to the first initiation region is initiated 110. A subsequent drop below a second force threshold prompts provision of a further haptic feedback item 111 and optionally a further audible feedback item 111. If the first force threshold is not exceeded 107, then the touch gesture is taken as a basis for initiating a touch function linked to the second initiation region 113. Optionally, the initiation of the touch function can prompt output of a haptic feedback item 114 and, likewise optionally, an audible feedback item at the same time as or with a subsequent or prior delay in respect of the haptic feedback item 115. Next, the method is performed again. The steps and/or actions that are denoted by the reference symbols 108 and 115 are performed or carried out only if the touch position that is sensed in a prescribed period of time before the sensed contact pressure exceeds the first force threshold is located in the first initiation region for the operator control element function accordingly linked thereto.

FIG. 13 shows an embodiment of the apparatus 1 for the input of data. A man/machine interface 60 contains the apparatus 1. By way of example, such a man/machine interface 60 may be a computer, a laptop, a tablet computer, a smartphone, an interactive table, a transport ticket machine, an information column, an interactive control apparatus, for example in control consoles. The apparatus 1 comprises a user programmable touch-sensitive display device 2 that has an actuator element 3 and a pressure force sensor 6 directly or indirectly connected to it. The user programmable touch-sensitive display device 2 has a touch area 12. The user programmable touch-sensitive display device 2, the actuator element 3 and the pressure force sensor 6 are connected to a control device 4. The control device 4 comprises an integration device 9, a classification device 10 and a comparison device 11. Optionally, the apparatus 1 can have a loudspeaker 7 connected to the control device 4, optionally on or in proximity to the user programmable touch-sensitive display device 2. An interface 8 connected to the control device 4 for communication with external appliances, for example via a bus system, another network or the Internet is likewise optional.

The control device 4 defines virtual operator control elements and first and second initiation regions. The virtual operator control elements are presented as a graphical representation on the user programmable touch-sensitive display device 2. Furthermore, the control device 4 can present further graphical representations, symbols, letters or pictograms on the user programmable touch-sensitive display device 2. The user programmable touch-sensitive display device 2 senses at least one touch position and supplies it to the control device 4. The integration device 9 combines temporally and locally adjacent touch positions to form touch traces and forwards the touch traces to the classification device 10. The classification device 10 classifies the touch traces according to touch gestures.

At the same time as the at least one touch position is sensed, a contact pressure on the user programmable touch-sensitive display device 2 is sensed by the pressure force sensor 6 and forwarded to the control device 4. The comparison device 11 then compares the classified touch traces and the contact pressure with a list of touch functions and operator control element functions that is stored in the comparison device 11 or the control device 4, for example. If a classified touch trace satisfies the criteria of one of the touch functions stored in the list, the relevant touch function is initiated. Optionally, the control device 4 can, at the same time as the touch function is initiated, output a signal to the actuator element 3 and/or a further signal to the loudspeaker 7. If a first force threshold on the pressure force sensor 6 is exceeded and if the touch positions previously sensed in a prescribed period of time are all located in the initiation region of a virtual operator control element, then the operator control element function associated with this operator control element is initiated and the control device 4 outputs a signal to the actuator element 3 when the first force threshold is exceeded; a subsequent drop below a second force threshold on the pressure force sensor 6 prompts the control device 4 to output a further signal to the actuator element 3. Optionally, exceeding of the first force threshold and/or a drop below the second force threshold can each prompt, at the same time as or with a subsequent or prior delay in respect of the relevant signal to the actuator element 3, output of a signal or of a plurality of signals from the control device 4 to the loudspeaker 7. A check to determine whether all the touch positions were or are located in the initiation region of a virtual operator control element in the prescribed period of time before the first force threshold is exceeded can be performed by the comparison device, for example, for the purpose of classifying the touch traces. This involves the first initiation region associated with the virtual operator control element being treated as a second initiation region, with a touch trace being classified as static or quasi-static if all the touch positions are located in the prescribed initiation region. When a static or quasi-static touch trace is classified for a first initiation region, the condition is met if the touch trace comprises at least all the touch positions that are located within the prescribed period of time.

Depending on the type of touch function or operator control element function that has been initiated, the control device 4 can change the graphical representation on the user programmable touch-sensitive display device 2 or leave it unchanged. Optionally, the touch position, the contact pressure, the touch trace and/or further data can be output to the interface 8. It is likewise possible for the control device 4 to be parameterized using the interface 8, for example by a central computer of the man/machine interface 60.

Optionally, the apparatus 1 is designed such that the tasks of the integration device 9, the classification device 10, the comparison device 11 and generally the control device 4 are performed on a software basis, for example in a single computer or microcontroller.

Modern motor vehicles are equipped with a multiplicity of supplementary functions that go beyond the pure transportation purpose of a motor vehicle. By way of example, these may be multimedia systems for receiving radio or reproducing media contents such as music, films or images, communication systems that allow worldwide voice-based or text-based communication, or even navigation systems that automatically compute the route on which the journey distance can be covered so as to save as much time as possible and to avoid queues as far as possible. In addition, systems are conceivable that provide the driver or an engineer what is known as an onboard computer with information about the state of the motor vehicle. A common feature of all of these systems is that they allow and presuppose interaction with the vehicle driver or the passengers via different input and output channels.

The prior art discloses a plurality of variants for how such a system can be controlled. Besides the increasingly vanishing keys, switches and controls in physical form in motor vehicles, there are above all virtually recreated operator control elements that can be operated or set using a touch-sensitive display (touchscreen), for example. To provide the user, following operator control, with feedback about the operation of a switch or a control, audible or haptic feedback items are customary. By way of example, after a key has been pressed, an audible or signal can indicate and confirm that the key has been pressed to the user. By way of example, a haptic feedback item can be provided as a vibration in the touch-sensitive display. This vibration is usually brought about with the aid of actuators fitted on the housing.

DE 10 2008 035 907 A1 discloses a touch-sensitive input appliance having a touch-force-dependent supplementary function. The apparatus relates to an input appliance having a control panel that is to be touched by an operating element that can be moved over the control panel or by a finger of a user, having means for sensing the position and/or movement of the operating element or the finger on the control panel, and an evaluation unit for producing a control signal that corresponds to the sensed variable. The input appliance is distinguished in that the control panel is embodied in elastically yielding form or is mounted in elastically yielding form in the direction of touch from a position of rest on the basis of a touch force produced by the operating element or the finger and in that case acts on at least one separate pressure sensor to produce a signal that is proportional to the touch force, and that the signal from the pressure sensor is supplied to the evaluation unit to produce a further control signal. When a force threshold is exceeded, a function can then be initiated and a haptic feedback item, i.e., a vibration, can be provided. Disclosed embodiments also relate to an associated method.

Although they provide positioning for a mouse pointer or for a selection position over a touch-sensitive display and initiation of a function when a force threshold is exceeded, the interactivity of the operator control is severely limited.

It is desirable to have an input method available in which the interactivity of the operator control is increased and the user can intuitively look for, select and initiate functions. In this case, there should also always be a distinguishable haptic feedback item for different types of operator control, so that the user finds his bearings more quickly, can select functions with more certainty and makes no or fewer operating errors.

Disclosed embodiments provide a method and an apparatus in which the input is embodied both flexibly and interactively.

LIST OF REFERENCE SYMBOLS

1 Apparatus
2 User programmable touch-sensitive display device
3 Actuator element
4 Control device
6 Pressure force sensor
7 Loudspeaker
8 Interface
9 Integration device
10 Classification device
11 Comparison device
12 Touch area
20 Virtual operator control element
21 Road map
22 Touch gesture
23 Push gesture
24 Further virtual operator control element
25 Keypad
26 Input field
27 Selection list
28 Cover list
30 Finger of the user
40 Multimedia display operator control apparatus
41 Front cover
42 Further housing portions
43 Continuous rotary control
44 Key in a physical form
50 Motor vehicle
60 Man/machine interface
80-83 Profile of a push gesture
101-115 Method steps

The invention claimed is:

1. An input method in a motor vehicle with haptic feedback, the method comprising:
   presenting at least one virtual operator control element on a user programmable touch-sensitive display device;
   sensing a touch position on the user programmable touch-sensitive display device;
   selecting a function via the touch position;
   sensing a contact pressure force on the user programmable touch-sensitive display device;
   initiating the selected function in response to a first force threshold being exceeded; and
   outputting haptic feedback,
   wherein temporally and locally adjacent touch positions are combined to form touch traces and the touch traces are classified according to touch gestures,
   wherein functions are divided into touch functions and operator control element functions,
   wherein one of the operator control element functions is associated with the at least one virtual operator control element,
   and the one operator control element function is selected in response to the touch positions of a touch trace being classified as a static gesture, during a stipulated time interval,
   the classification of the static gesture requiring all of the touch positions being located in an initiation region of the at least one virtual operator control element with which the operator control element function is associated, and the one operator control element function is initiated in response to the first force threshold being exceeded, subsequent to all of the touch positions being located in the initiation region of the at least one virtual operator control element while the one operator control element function is selected,
   wherein this exceeding of the first force threshold prompts haptic feedback to be output, and only when the one operator control element function is selected and the first force threshold prompts haptic feedback, then a subsequent drop below a second force threshold is followed by further haptic feedback, which is different than the first, being output, wherein at least one second initiation region on the user programmable touch-sensitive display device has at least one associated touch function that is initiated by a stipulated touch gesture, the second initiation region comprising the entire display device, and wherein the at least one associated touch function is only initiated when a touch force associated with the touch gesture is below the first threshold.

2. The method of claim 1, wherein, at the same time as the haptic feedback, an audible signal is output.

3. The method of claim 1, wherein the first and second initiation regions overlap.

4. The method of claim 1, wherein an operator control element function is not initiated in response to the first force threshold being exceeded when the exceeding takes place at a sensed touch position that is part of a touch trace classified as a touch gesture.

5. The method of claim 1, wherein the haptic feedback is embodied as pulsed deflections of a touch area of the user programmable display area.

6. The method of claim 1, wherein initiation of a touch function prompts or is followed by provision of a haptic feedback.

7. The method of claim 1, wherein, after the first force threshold for initiation of an operator control element function has been exceeded, there are further force thresholds that, as a result of being exceeded or experiencing a drop below them, prompt provision of a haptic feedback.

8. The method of claim 1, wherein the first and the second and, if present, the further force threshold and the associated haptic feedback is embodied so a physical key is simulated.

9. The method of claim 1, wherein an interface is used to provide the sensed touch position, information about the initiated operator control element functions and touch functions and/or further data.

10. The method of claim 1, wherein the input method is controlled via an interface.

11. The method of claim 1, wherein the information presented on the touch-sensitive display is altered on the basis of whether a touch function or an operator control element function has been initiated.

12. An apparatus in a motor vehicle for the interactive input of data with haptic feedback, the apparatus comprising:

a user programmable touch-sensitive display device for sensing a touch position and presenting information;

a pressure force sensor, which is directly or indirectly connected to the user programmable touch-sensitive display device, for sensing a contact pressure force;

an actuator element, which is directly or indirectly connected to the user programmable touch-sensitive display device, for outputting a haptic feedback item; and a control device;

wherein the control device combines temporally and locally adjacent touch positions to form touch traces and classifies them according to touch gestures, wherein the control device presents at least one virtual operator control element on the user programmable touch-sensitive display device, wherein the at least one virtual operator control element is assigned a first initiation region on the user programmable touch-sensitive display device and an operator control element function, and the control device monitors the contact pressure force and, in the event of a first force threshold being exceeded, to initiate the operator control element function, provided that the touch positions previously sensed prior to the first force threshold being exceeded and during a stipulated time interval are located in the initiation region of the at least one virtual operator control element with which the operator control element function is associated, wherein this exceeding of the first force threshold prompts the control device to output a signal to the actuator element, and a subsequent drop below a second force threshold subsequent to all of the touch positions being located in the initiation region of the at least one virtual operator control element is followed by a further signal, which is different than the first signal, being output on the actuator element, wherein the control device associates at least one touch function with at least one second initiation region, the at least one second initiation region being the entire display device, on the user programmable touch-sensitive display device and, in response to a stipulated touch gesture occurs, initiates the at least one touch function, and wherein at least one touch function is only initiated when a sensed contact pressure force associated with the touch gesture is below the first threshold,.

13. The apparatus of claim 12, wherein the control device outputs a signal to the actuator element when a touch function is initiated.

14. The apparatus of claim 12, wherein the apparatus comprises a loudspeaker, and an audible signal is output by the control device on this loudspeaker at the same time as or with a subsequent or prior delay in relation to the output of the haptic feedback items.

15. The apparatus of claim 12, wherein the apparatus comprises an interface that the control device can use to output and receive data.

16. The apparatus of claim 15, wherein the control device is controlled by a central computer or another microcontroller.

17. An input method with haptic feedback, the method comprising:

presenting at least one virtual operator control element on a user programmable touch-sensitive display device;

sensing a touch position on the user programmable touch-sensitive display device;

selecting a function via the touch position;

sensing a contact pressure force on the user programmable touch-sensitive display device;

initiating the selected function in response to a first force threshold being exceeded; and outputting haptic feedback, wherein temporally and locally adjacent touch positions are combined to form touch traces and the touch traces are classified according to touch gestures, wherein functions are divided into touch functions and operator control element functions, wherein one of the operator control element functions is associated with the at least one virtual operator control element, and the one operator control element function is selected in response to the touch positions of a touch trace being classified as a static gesture, during a stipulated time interval, the classification of the static gesture requiring that all of the touch positions are located in an initiation region of the at least one virtual operator control element with which the operator control element function is associated, and the one operator control element function is initiated in response to the first force threshold is exceeded, subsequent to all of the touch positions being located in the initiation region of the at least one virtual operator control element, while the one operator control element function is selected, wherein this exceeding of the first force threshold prompts haptic feedback to be output, and a subsequent drop below a second force threshold only after the first force threshold is exceeded is followed by further haptic feedback, which is different than the first, being output, and wherein at least one second initiation region on the user programmable touch-sensitive display device, the second initiation region being the entire display device, has at least one associated touch function that is initiated by a stipulated touch gesture, wherein the at least one touch function of the touch functions is only initiated when a touch force associated with the touch gesture is below the first threshold.

18. An apparatus for interactive input of data with haptic feedback, the apparatus comprising:
a user programmable touch-sensitive display device for sensing a touch position and presenting information;
a pressure force sensor, which is directly or indirectly connected to the user programmable touch-sensitive display device, for sensing a contact pressure force;
an actuator element, which is directly or indirectly connected to the user programmable touch-sensitive display device, for outputting a haptic feedback item; and
a control device,
wherein the control device combines temporally and locally adjacent touch positions to form touch traces and classifies them according to touch gestures, wherein the control device presents at least one virtual operator control element on the user programmable touch-sensitive display device, wherein the at least one virtual operator control element is assigned a first initiation region on the user programmable touch-sensitive display device and an operator control element function, and the control device monitors the contact pressure force and, in the event of a first force threshold being exceeded, to initiate the operator control element function, provided that the touch positions previously sensed prior to the first force threshold being exceeded and during a stipulated time interval are located in the initiation region of the at least one virtual operator control element with which the operator control element function is associated, wherein this exceeding of the first force threshold prompts the control device to output a signal to the actuator element, and a subsequent drop below a second force threshold only after the first threshold has been exceeded is followed by a further signal, which is different than the first signal, being output on the actuator element, wherein the control device associates at least one touch function with at least one second initiation region on the user programmable touch-sensitive display device and, in response to a stipulated touch gesture occurs, initiates the at least one touch function wherein at least one touch function is only initiated when a touch force associated with the touch gesture is below the first threshold.

* * * * *